United States Patent [19]

Teh

[11] Patent Number: 5,734,792

[45] Date of Patent: Mar. 31, 1998

[54] ENHANCEMENT METHOD FOR A COARSE QUANTIZER IN THE ATRAC

[75] Inventor: Do Hui Teh, Singapore, Singapore

[73] Assignee: Matsushita Electric Industrial Co., Ltd., Kadoma, Japan

[21] Appl. No.: 161,796

[22] Filed: Dec. 6, 1993

[30] Foreign Application Priority Data

Feb. 19, 1993 [JP] Japan ................................. 5-030713

[51] Int. Cl.$^6$ ................................................. G10L 3/02
[52] U.S. Cl. .................................. 395/2.39; 395/2.43
[58] Field of Search ........................... 395/2.39, 2.38, 395/2.43

[56] References Cited

U.S. PATENT DOCUMENTS 4,964,166 10/1990 Wilson ..................................... 381/34
5,264,846 11/1993 Oikawa ................................... 341/76
5,471,558 11/1995 Tsutsui ................................ 395/2.28

FOREIGN PATENT DOCUMENTS 0481374 4/1992 European Pat. Off. .
0506394 9/1992 European Pat. Off. .

OTHER PUBLICATIONS

Chapter 10 of the Mini Disc System Description by Sony (1991).
Patent Abstrat of Japan, vol. 16, No. 412 (E–1256) to Kenji et al., dated Aug. 31, 1992 (relating to Japanese Patent Appl. No. 04-137,822 published May 12, 1992).

Primary Examiner—Allen R. MacDonald
Assistant Examiner—Susan Wieland
Attorney, Agent, or Firm—Beveridge, DeGrandi, Weilacher & Young, LLP

[57] ABSTRACT

A method for enhancing a block companding uniform midtread quantizer in the ATRAC (Adaptive Transform Acoustic Coding) for the quantization of digital audio signals, wherein the audio signals are represented by a plurality of frames of quantized spectral components. The method includes modifying all spectral sample values in a defined frequency interval by a constant factor, calculating a scale factor for the frequency interval from a maximum spectral sample value, and quantizing all the spectral samples in the modified frequency interval with a modified quantizer.

2 Claims, 7 Drawing Sheets

FIG. 4

| UNIT NUMBER | SPECTRAL LINE NUMBER | BIT ALLOCATION DATA |
|---|---|---|
| UNIT 0 | 8 | WL(0) |
| UNIT 1 | 4 | WL(1) |
| UNIT 2 | 4 | WL(2) |
| UNIT 3 | 4 | WL(3) |
| | | |
| UNIT 24 | 10 | WL(24) |
| UNIT 25 | 10 | WL(25) |

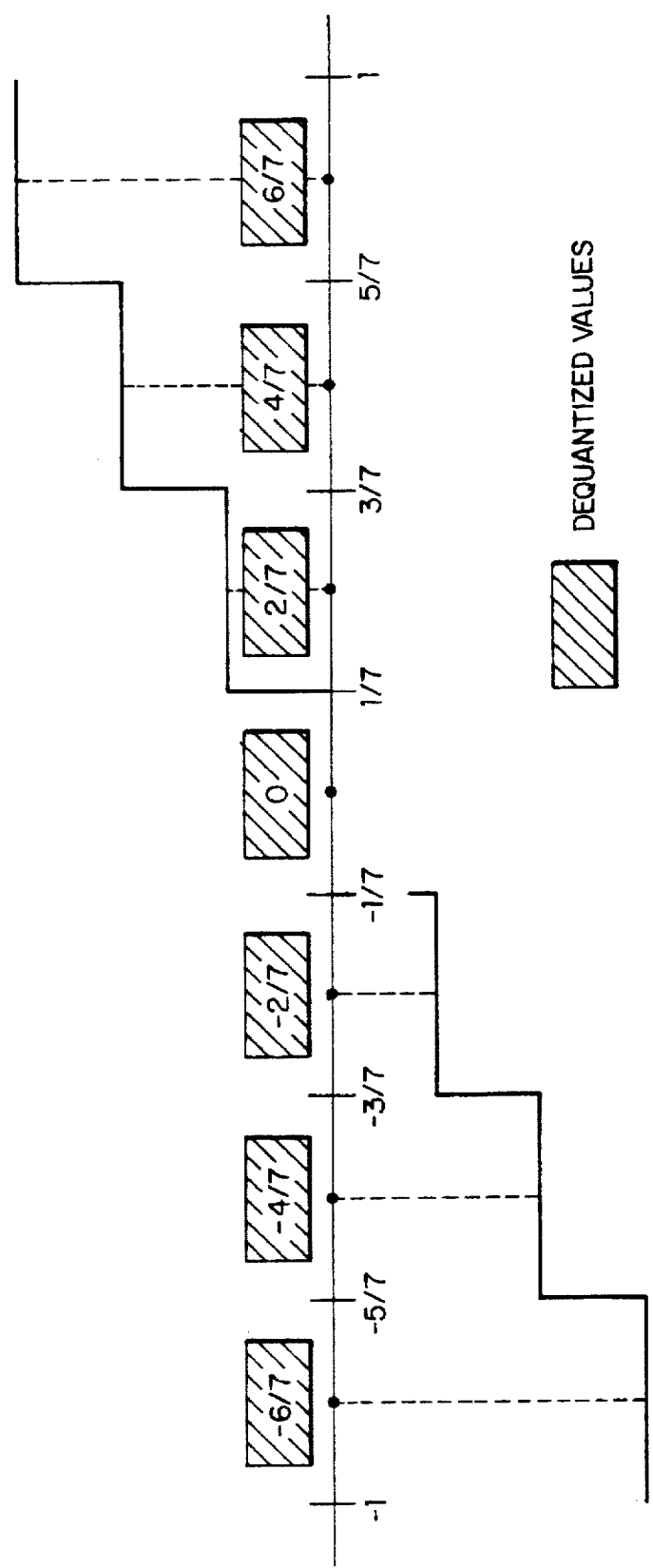

ENHANCEMENT METHOD FOR A COARSE QUANTIZER IN THE ATRAC

BACKGROUND OF THE INVENTION

1. Fields of The Invention

This invention relates to the efficient information coding of digital audio signals for transmission or digital storage media.

2. Related Art of The Invention

Compression algorithms for wide band audio signals are finding wide-spread applications in recent years. In the area of consumer electronics, the digital compact cassette (DCC) and the mini-disc system (MD) are two applications of these compression algorithms. While the DCC system uses a compression algorithm that is based on subband coding the MD system uses an algorithm that is based on a hybrid of subband arid transform coding with the transform coding portion forming the backbone of the algorithm. This invention is related to the quantization in the MD coder.

The MD system Uses the ATRAC compression algorithm that is documented in chapter 10 of the MD system description by Sony in December 1991. The ATRAC algorithm compresses the input audio signals at a bit rate of 705.6 k bit/s/channel to a bit rate of 146.08 k bit/s/channel FIG. 5 shows the block diagram of the encoding process. The input time signals are first passed through a splitting filter bank, 1, 2, 3, to obtain the signals in three frequency bands. The lower two bands are each at half the bandwidth of the uppermost band. Block size decision, 4, is made for eachband to determine the sample size or block mode for the windowing and transform process, 5, 6, 7. One of the two block modes available—short block mode or long block mode, will be selected for each of the bands. The transformed spectral samples are grouped into units and in each unit, a scale factor is derived from the peak values of the samples in the unit, 8. These units are non-uniform frequency intervals with a closer interval in the low frequencies and a wider interval in the higher frequencies. Quantization, 10, is carried out on the samples using the scale factor and bit allocation information from the dynamic bit allocation module, 9.

The quantizer used in the prior art is a uniform midtread quantitizer. The relationship between the original spectral sample (ASD) and the quantized spectral sample (AS) is given by:

$$AS[m] = Trunc\left\{ \frac{ASD[m]}{SF[n]} (2^{WL[n]-1} - 1) + 0.5 \right\} \text{ if } ASD[m] \geq 0 \quad \text{equation 1}$$

$$AS[m] = Trunc\left\{ \frac{ASD[m]}{SF[n]} (2^{WL[n]-1} - 1) - 0.5 \right\} \text{ if } ASD[m] < 0$$

where m is the sample index, SF[n] is the scale factor value at unit n and WL[n] is the word length or bit allocation at unit n. Trunc{x}means discards the digits after the decimal point regardless of the sign of x. The meaning of the "unit" is described as follows.

The audio signal is transformed into ,for example , 256 spectral lines by MDCT. The spectral lines are grouped into plural units. In FIG. 4 the 256 spectral lines are grouped into 26 number of units of 0–25. The bit allocation data WL(u) iS given by unit as shown in FIG. 5. In the example of FIGS. 4, 5, the spectral line numbers 1–8 have the same bit allocation data WL(0) and the spectral line numbers 9–12 have the same bit allocation data WL(1).

FIG. 6 shows a diagram of the quantizer with WL[n]=3, that is a 3 bit quantizer.

Meanwhile the quantizer in any coding algorithm plays an important role in attaining good audio quality. It is at this stage where the signals are finally compressed or represented in compressed form. In a midtread quantizer, the number of signal steps that are represented in a bitstream by WL bits is given by $2^{WL}-1$. This represents a loss of one step for every WL number of bits used. This loss is inevitable in order to tap the advantage of the midtread quantizer of approximating low level signals, not exceeding 1 step of the quantizer, to zero instead of some stray values. The maximum quantization error for a block companding type of coder for a frequency interval or unit, n, $\epsilon$ is given by $$\epsilon = \frac{SF[n]}{2^{WL[n]} - 1} \quad \text{equation (2)}$$

In the prior art, the spectral samples are coded using $2^{WL}-1$ codes. However, due to the distribution of levels in the quantizer, the maximum quantization error of the prior art is $$\epsilon = \frac{SF[n]}{2^{WL[n]} - 2} \quad \text{equation (3)}$$

This can be observed from the illustration of the 3 bit quantizer in FIG. 6. Consider the case of a spectral sample which after being normalized by its scale factor lies in the region of 0.17 to 0.5. Its final dequantized value is 0.33 which gives a maximum normalized error of 0.17 or ⅙. FIG. 7 shows a quantizer where there is an even distribution of the levels across the range of the quantizer. If this quantizer is used instead of the one in FIG. 6, the maximum normalized error will be 0.14 or ⅐. While the quantizer in FIG. 5 suffers a 12.5% increase in quantization noise, the quantizer in the prior art suffers a 25% increase, an additional 12.5%. This increase in quantization noise is even greater in effect when WL[n] is equal to 2. In this case up to 25% of quantization noise is generated, or conversely if a constant noise level is to be attained, then 25% more of the channel capacity will be used up. This inefficient use of bits is particularly serious as experience has shown that 2 to 3 bit allocation are the most frequently occurring allocation at this bit rate of operation (146.08 kbit/s). Further, these two types of allocation in general occur more frequently in the units at high frequencies where more spectral samples are grouped. This would further compound the quantizer loss. As an example, units at high frequencies are made up of 20 spectral samples and if 2 bits are allocated to this unit, the number of bits used up by this unit is 40, out of which, only 20 bits are carrying useful information. Then, 10 bits of loss are contributed by the fact that it is a midtread quantizer and the other 10 bits are contributed by the inefficient use of the dynamic range of the quantizer. For quantizations using 4 bits or more, the loss is less significant and diminishes with increasing number of bits of quantizations.

SUMMARY OF THE INVENTION

The object of this invention is to reduce the loss in the quantizer while at the same time not affecting the original bitstream syntax of the algorithm.

For the purpose of achieving the above object, the invention comprises of the means of determining if enhancement is required for the particular interval; the means of modifying all the spectral samples in the interval; the means of finding the scale factor of the interval from the maximum value of the spectral samples and the means of quantizing all the spectral samples in the interval with a modified quantizer which uses the full dynamic range of a midtread quantizer.

Through the method described above, the present invention is able to selectively enhance the outputs of the quantizer when necessary so that no additional computational steps are incurred where the effect of the enhancement is almost negligible. Additionally, through the method of modifying the spectral samples and thus the scale factors of the units enhanced, the bitstream syntax is kept to be the same and the effect of the enhancement is independent of the decoder used.

BRIEF DESCRIPTION OF THE DRAWINGS

FIG. 4 is the table of the bit allocation data WL.

FIG. 7 is the illustration of a 3 bit quantizer using the full range of a midtread quantizer.

PREFERRED EMBODIMENTS

Figure 1:
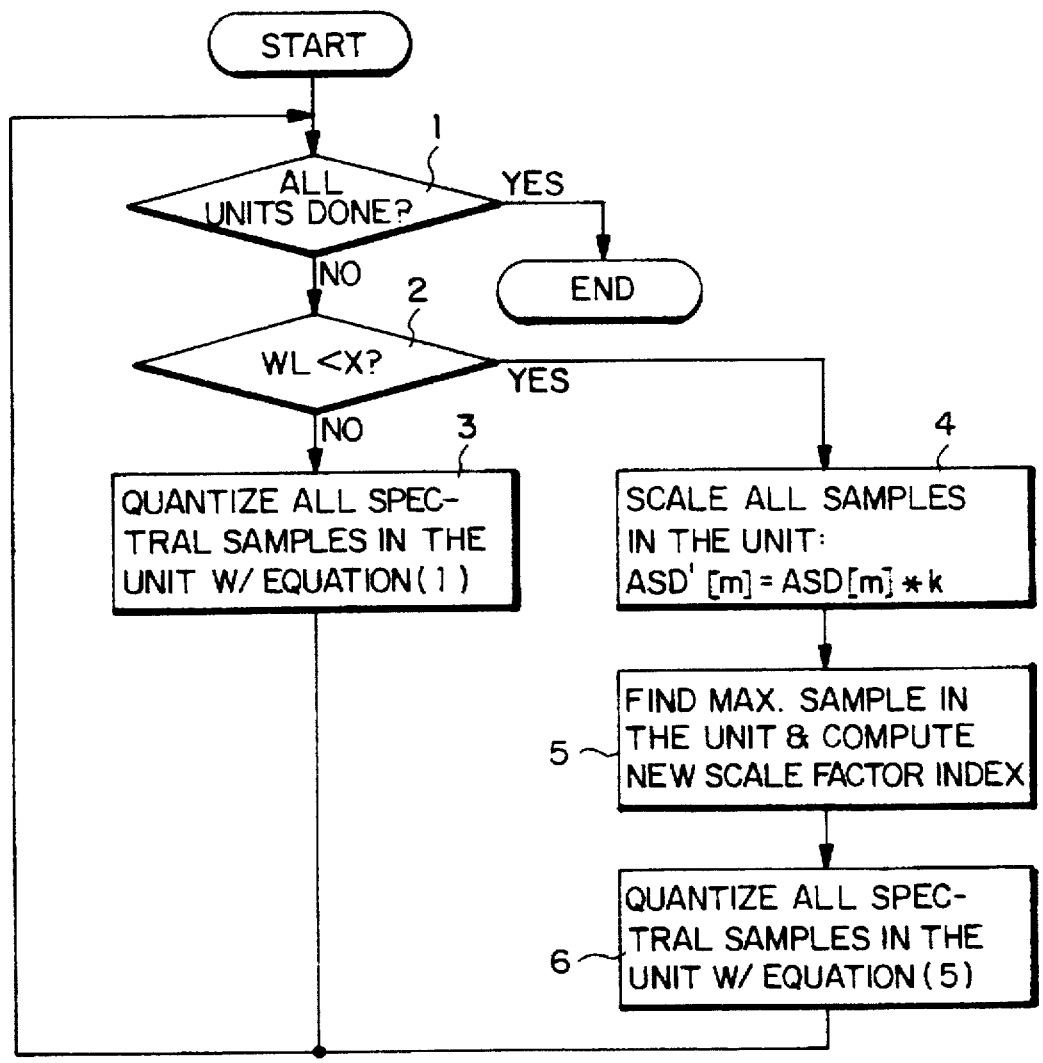
FIG. 1 is the flow chart of the present embodiment of the invention.

FIG. 1 shows an embodiment of the invention. The operation of the embodiment is given in the steps below:

[1] Check if all the units have been processed (step of numeral 1). If yes, then end.

[2] The bit allocation of the unit, is checked to determine if it is less than X (Step of numeral 2). The value of X can either be selectable from a table or be fixed for example at 4 or 5 as the affect of the enhancement is diminishing with increasing bit allocation, WL as shown in Table 1.

TABLE 1

| WL[n] | Improvement in quantization noise control |
|---|---|
| 2 | 25% |
| 3 | 12.5% |
| 4 | 6.25% |
| 5 | 3.125% |
| 6 | 1.5625% |

[3] If WL is not less than X, then all the spectral samples are quantized with the quantizer relation of the prior art. (equation 1) (step of numeral 3).

[4] If WL is less than X, all the samples in the unit are then scaled by k (step of numeral 4). The value k is given by $$k = \frac{2^{WL[n]} - 2}{2^{WL[n]} - 1} \qquad \text{equation (4)}$$

The modified spectral sample is denoted by ASD'[m].

[5] The maximum sample in the unit is then searched and the new scale factor index is computed. (step of numeral 5)

[6] All the spectral samples in this unit are then quantized, (step of numeral 6), with the modified quantizer having the relation:

$$AS[m] = Trunc \left\{ \frac{2^{WL[n]} - 1}{2} \left[ \frac{ASD'[m]}{SF[n]} + 1 \right] \right\} - 2^{WL[n]-1} - 1 \qquad \text{equation (5)}$$

Figure 2:
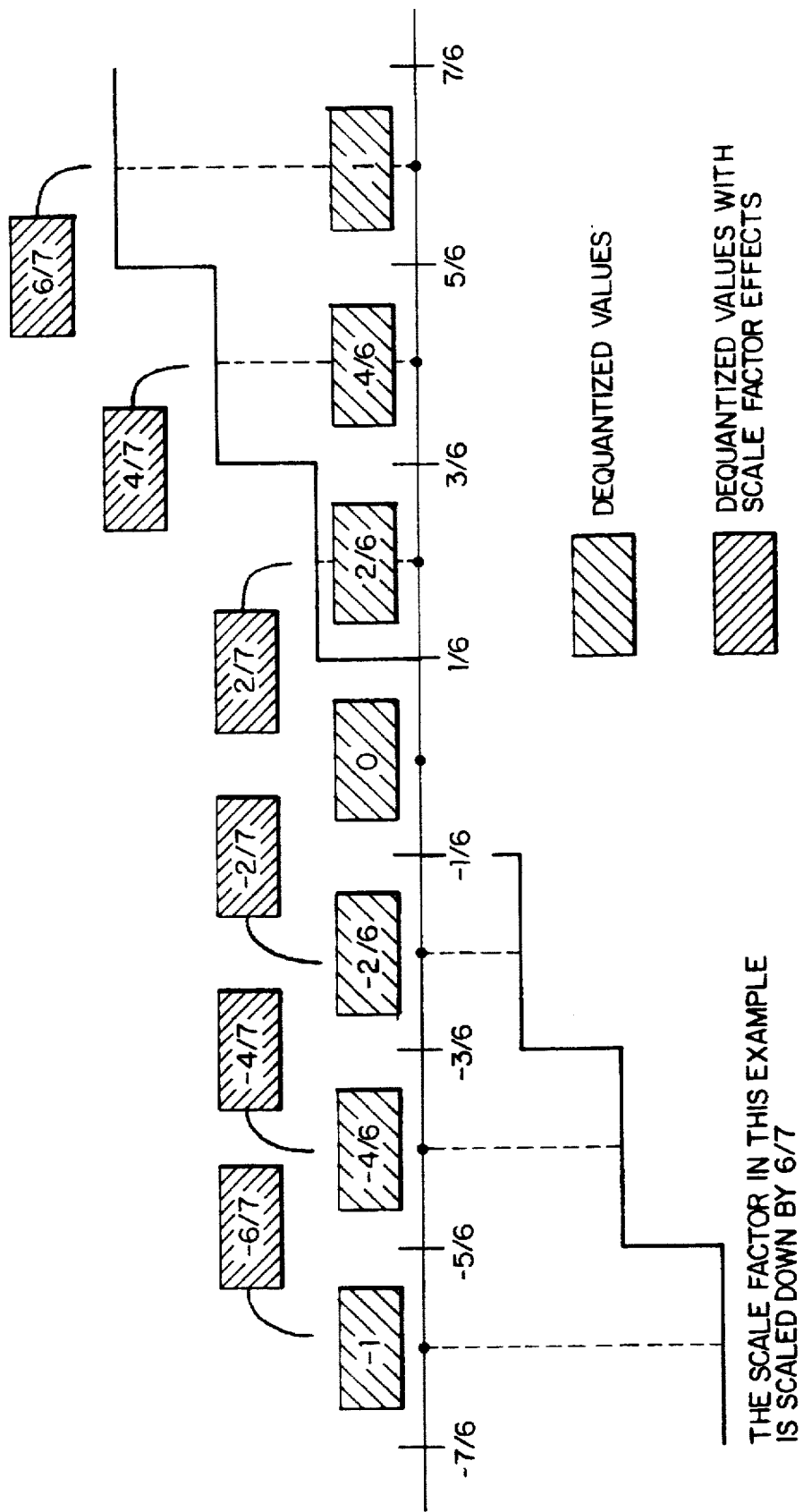
FIG. 2 is the illustration of a 3 bit quantizer using the invention.
Figure 3:
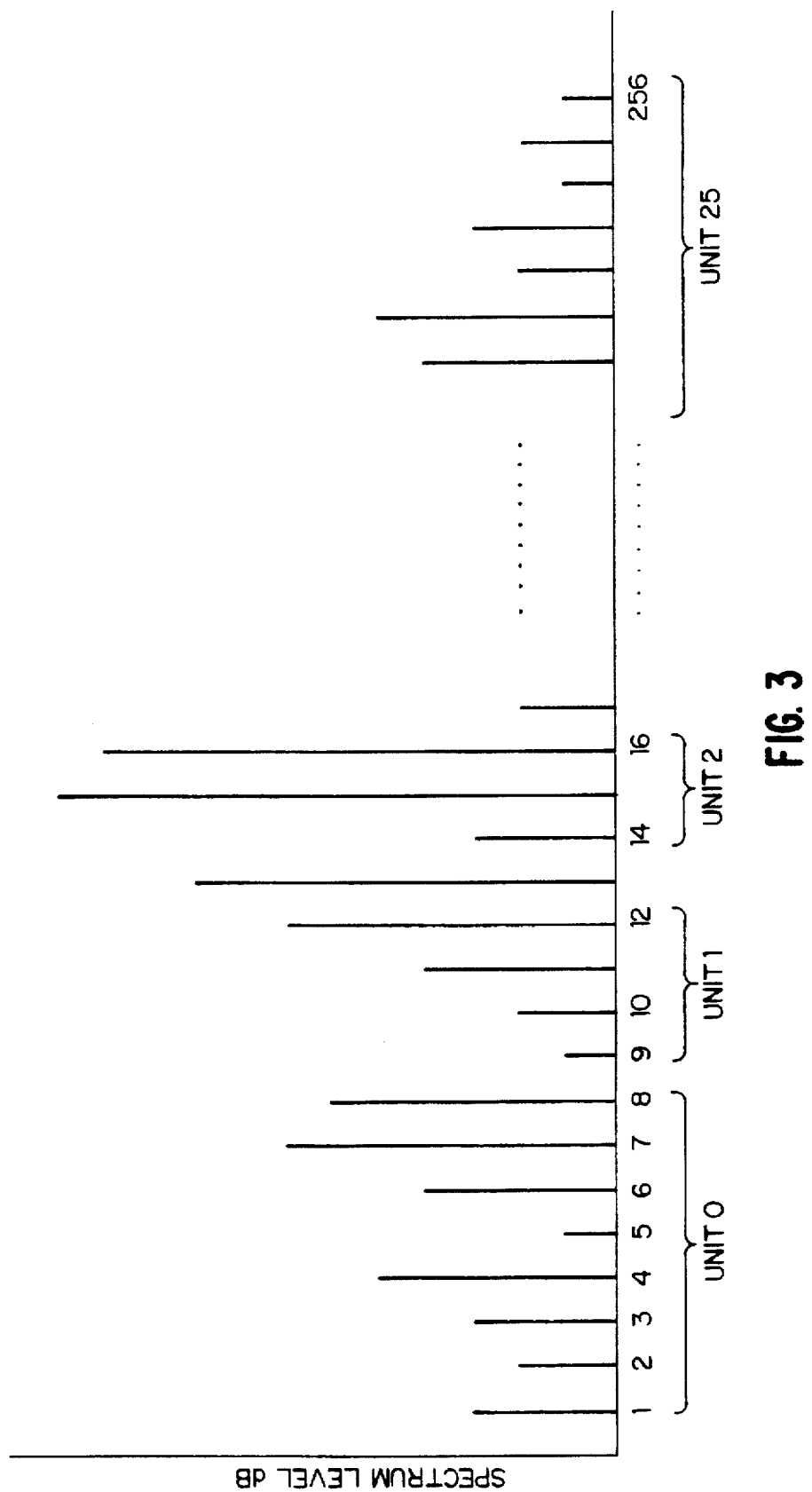
FIG. 3 is the illustration of a spectrum grouped into 26 units.
Figure 5:
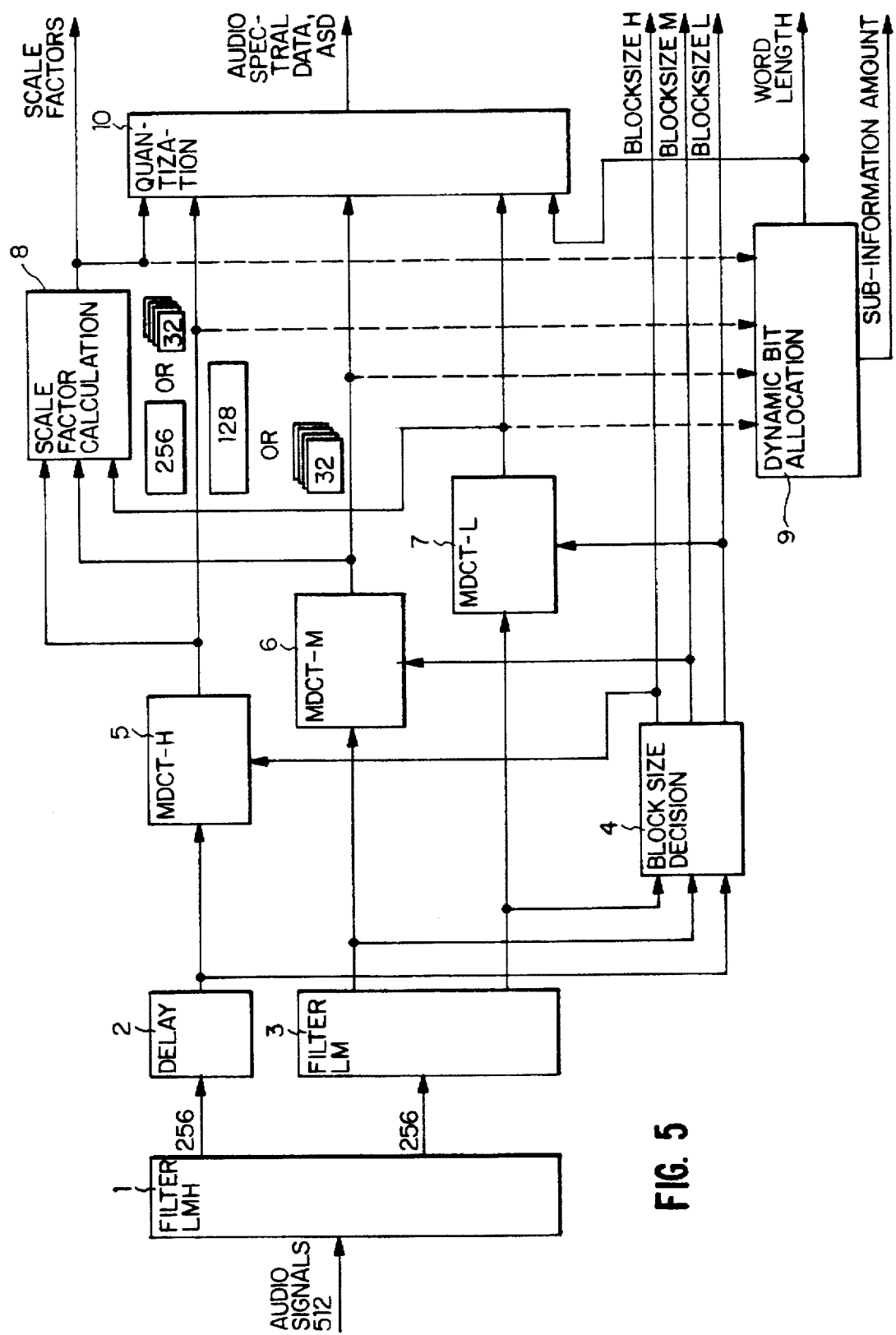
FIG. 5 is the block diagram of the encoding process in the prior art.
Figure 6:
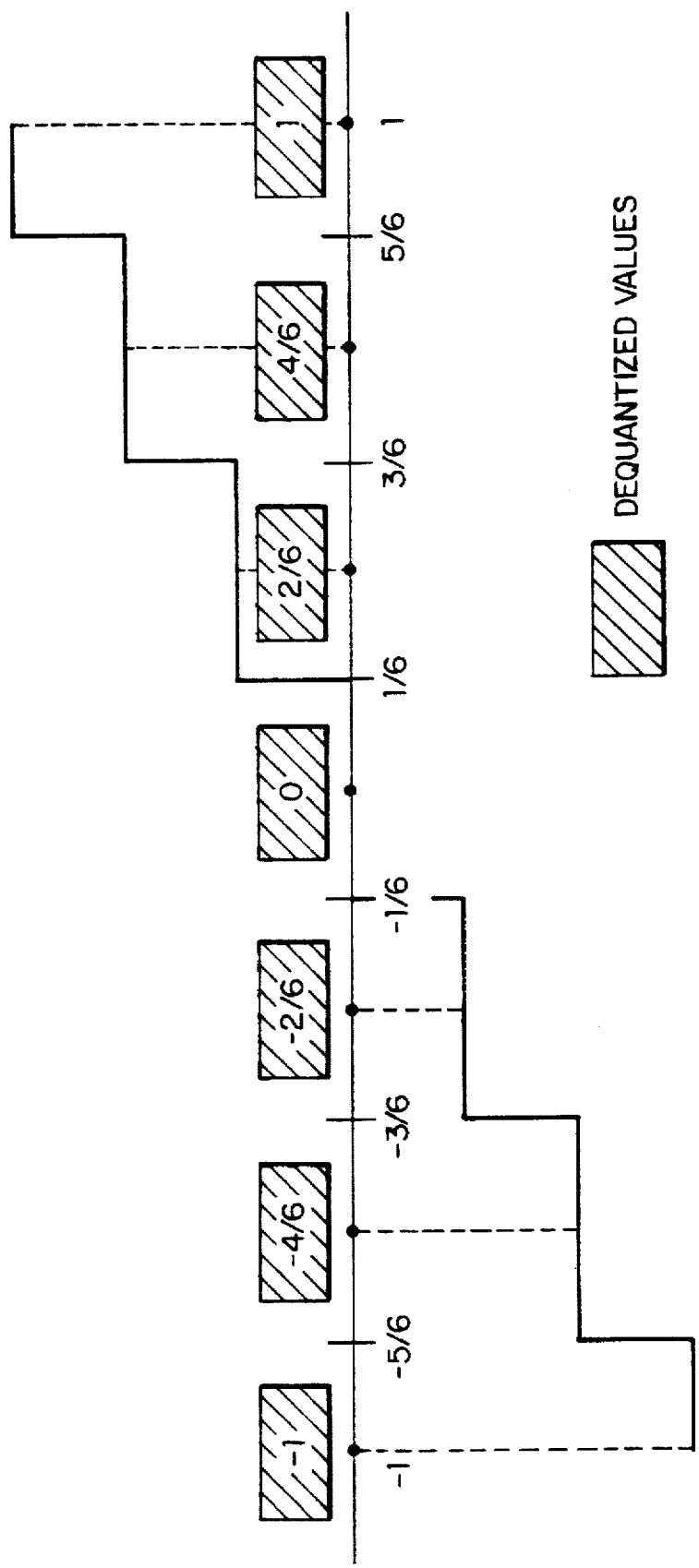
FIG. 6 is the. illustration of a 3 bit quantizer using the quantizer in the prior art.

The steps are then repeated until all the units are done. The invention. in effect extends the quantizer dynamic range as in the case of WL=3 from +/−1 to +/−1.17 (or 7/6) as shown in FIG. 2. Since this syntax is unacceptable in the bitstream, the scale factor has to be reduced by k=1.17 (or 7/6) so that the original bitstream syntax can be maintained. With this reduction of k in the scale factor, the maximum error, $\epsilon$ is given by $$\epsilon = \frac{SF[n]}{(2^{WL[n]} - 2) * k} \qquad \text{equation (6)}$$

While theoretically, an improvement in quantization noise is always obtained, due to the quantization of the scale factor, the effectiveness of this improvement is slightly reduced. However, it can be theoretically proven that even under an extreme circumstance, $\epsilon_{new} \leq \epsilon_{old}$ where $\epsilon_{new}$ is the error of the invention and $\epsilon_{old}$ is the error of the prior art.

Meanwhile in the present invention , after judging the necessity of enhancement required in each frequency interval and, if necessary the above steps are executed. But even when the enhancement yields a very small improvement as in the case when the word length is large, the present invention is applicable.

The invention, while maintaining the bitstream syntax, is able to reduce the quantization noise in the original MD system. Conversely, it can also be said that this enhancment technique allows for a better utilization of the channel resources than the original system.

This enhancement technique is particularly effective in coarse quantization i.e. quantization of 3 bits and below, and at high frequencies where the savings are very significant. While this technique incurred some computational steps, its results are good enough to improve the quality of the audio.

What is claimed is:

1. A method of enhancing a midtread quantizer for quantization of digital audio signals, wherein an audio signal is represented by a plurality of frames of quantized spectral components, said method comprising the steps of:

modifying all spectral sample values, ASD[m], in a defined frequency interval by a constant factor, k, to obtain modified spectral sample values, ASD'[m], wherein $$k = \frac{2^{WL[n]} - 2}{2^{WL[n]} - 1}$$

and wherein

WL[n] is a quantization step size, m is a spectral sample number, and n is a frequency interval number;

calculating a scale factor for the frequency interval from a maximum spectral sample value;

quantizing all modified spectral samples in the frequency interval according to the relation $$AS[m] = Trunc \left\{ \frac{2^{WL[n]} - 1}{2} \left[ \frac{ASD'[m]}{SF[n]} + 1 \right] \right\} - 2^{WL[n]-1} - 1$$

wherein

AS[m] is a spectral sample after quantization,

SF[n] is a scale factor, "Trunc" is a round-down function to omit figures below a decimal point.

2. Method according to claim 1, comprising the steps of determining whether WL[n] is smaller than a predetermined value, and executing the steps of modifying, calculating, and quantizing when it is determined in the determining step that WL[n] is smaller than the predetermined value.

* * * * *